(12) United States Patent
Mizutani et al.

(10) Patent No.: US 9,564,374 B2
(45) Date of Patent: Feb. 7, 2017

(54) FORMING METHOD AND METHOD OF MANUFACTURING ARTICLE

(71) Applicant: CANON KABUSHIKI KAISHA, Tokyo (JP)

(72) Inventors: Masaki Mizutani, Utsunomiya (JP); Kenichiro Mori, Utsunomiya (JP); Seiya Miura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/644,735

(22) Filed: Mar. 11, 2015

(65) Prior Publication Data

US 2015/0262890 A1 Sep. 17, 2015

(30) Foreign Application Priority Data

Mar. 11, 2014 (JP) .................. 2014-048070

(51) Int. Cl.
*H01L 21/00* (2006.01)
*H01L 21/66* (2006.01)
(Continued)

(52) U.S. Cl.
CPC ......... *H01L 22/12* (2013.01); *H01L 21/76898* (2013.01); *H01L 23/544* (2013.01);
(Continued)

(58) Field of Classification Search
CPC ........ H01L 22/12; H01L 25/50; H01L 23/544; H01L 21/76898; H01L 2223/54453; H01L 2223/54426
(Continued)

(56) References Cited

U.S. PATENT DOCUMENTS 5,468,580 A * 11/1995 Tanaka ...................... G03F 9/70
355/53
5,783,341 A * 7/1998 Uzawa ................ G03F 7/70425
430/22
(Continued)

FOREIGN PATENT DOCUMENTS

JP         07321012 A    12/1995
TW         201332043 A    8/2013
TW         201438186 A   10/2014

OTHER PUBLICATIONS

Taiwanese Office Action issued in Taiwanese counterpart application No. TW104105334, dated Jan. 25, 2016. English translation provided.

*Primary Examiner* — Phat X Cao
*Assistant Examiner* — Mohammad M Hoque
(74) *Attorney, Agent, or Firm* — Rossi, Kimms & McDowell LLP

(57) ABSTRACT

The present invention provides a forming method of forming a through electrode, in a second substrate joined on a first substrate having an electrode pad, to electrically connect a pattern to be formed on the second substrate to the electrode pad, the method comprising steps of detecting a position of a first mark formed on the first substrate and a position of a second mark formed on the second substrate in a state in which the first substrate and the second substrate are joined, determining, based on the position of the first mark and the position of the second mark detected in the detecting, a point to form the through electrode in the second substrate so as to electrically connect the pattern to the electrode pad, and forming the through electrode at the determined point.

15 Claims, 10 Drawing Sheets

(51) Int. Cl.
*H01L 21/768* (2006.01)
*H01L 23/544* (2006.01)
*H01L 25/00* (2006.01)

(52) U.S. Cl.
CPC .... *H01L 25/50* (2013.01); *H01L 2223/54426* (2013.01); *H01L 2223/54453* (2013.01); *H01L 2924/0002* (2013.01)

(58) Field of Classification Search
USPC .......................................................... 438/5
See application file for complete search history.

(56) References Cited

U.S. PATENT DOCUMENTS

| | | | | |
|---|---|---|---|---|
| 6,838,686 | B2* | 1/2005 | Kataoka | G03F 9/7003 250/492.22 |
| 9,151,593 | B2* | 10/2015 | Holzapfel | G01B 11/002 |
| 2003/0193076 | A1* | 10/2003 | Patti | H01L 21/76898 257/620 |
| 2006/0103033 | A1* | 5/2006 | Van Haren | G03F 7/70633 257/797 |
| 2010/0139836 | A1* | 6/2010 | Horikoshi | H01L 21/67092 156/64 |
| 2010/0168908 | A1* | 7/2010 | Maeda | H01L 21/67092 700/228 |
| 2013/0139950 | A1* | 6/2013 | Kannaka | G01B 11/272 156/64 |
| 2013/0267046 | A1* | 10/2013 | Or-Bach | H01L 27/088 438/14 |
| 2013/0299062 | A1* | 11/2013 | Ng | B32B 38/1841 156/64 |
| 2014/0225246 | A1 | 8/2014 | Henderson et al. | |
| 2014/0284780 | A1* | 9/2014 | Kinoshita | H01L 23/544 257/676 |

* cited by examiner

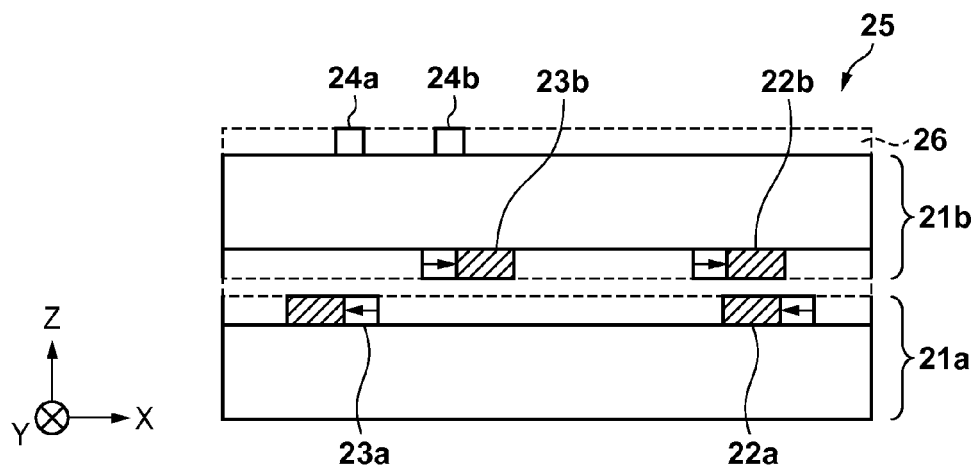
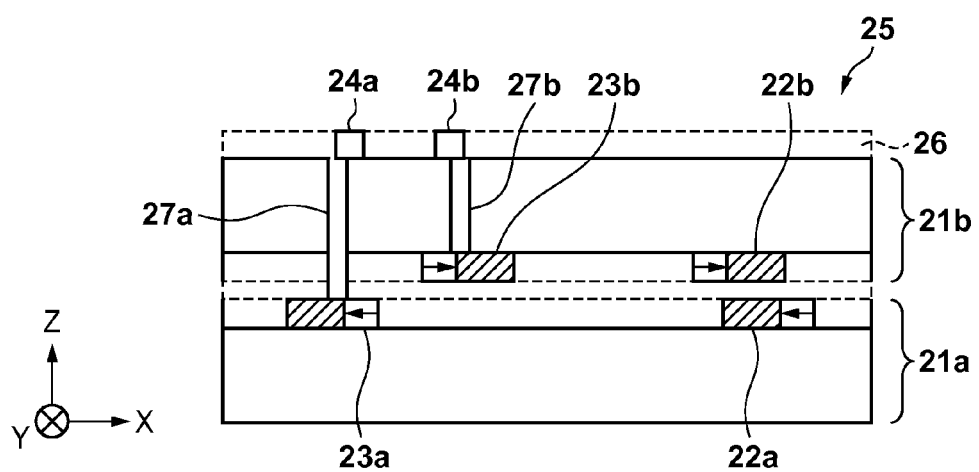

FORMING METHOD AND METHOD OF MANUFACTURING ARTICLE

BACKGROUND OF THE INVENTION

Field of the Invention

The present invention relates to a forming method of forming a through electrode in a substrate, and a method of manufacturing an article.

Description of the Related Art

There is a method of forming a plurality of layers of circuit patterns overlaid when manufacturing a semiconductor device or the like. Japanese Patent Laid-Open No. 7-321012 describes a positioning method used when forming a plurality of layers of circuit patterns overlaid on one substrate.

A technique of manufacturing a semiconductor device by overlaying a plurality of substrates each including a circuit pattern has recently received attention. In this technique, a circuit pattern is formed on each of a plurality of substrates, and after that, the plurality of substrates are overlaid and joined. After the plurality of substrates are joined, a through electrode (Through Silicon Via; TSV) to electrically connect the circuit patterns of the substrates is formed in each substrate. For example, a through electrode to electrically connect the circuit pattern of a first substrate and the circuit pattern of a second substrate joined on the first substrate is formed in the second substrate.

However, when overlaying and joining a plurality of substrates, a position deviation of circuit pattern may occur between the plurality of substrates due to an overlay error between the plurality of substrates, deformation of the substrates caused by joint stress, and the like. If a through electrode is formed based on, for example, the marks (alignment marks) of the second substrate in a case where the position deviation has occurred, the through electrode may be prevented from contacting the circuit pattern (electrode pad) of the first substrate. In this case, the circuit pattern of the first substrate and that of the second substrate cannot be electrically connected.

SUMMARY OF THE INVENTION

The present invention provides a technique advantageous in, for example, forming a through electrode in a substrate.

According to one aspect of the present invention, there is provided a forming method of forming a through electrode, in a second substrate joined on a first substrate having an electrode pad, to electrically connect a pattern to be formed on the second substrate to the electrode pad, the method comprising steps of: detecting a position of a first mark formed on the first substrate and a position of a second mark formed on the second substrate in a state in which the first substrate and the second substrate are joined; determining, based on the position of the first mark and the position of the second mark detected in the detecting, a point to form the through electrode in the second substrate so as to electrically connect the pattern to the electrode pad; and forming the through electrode at the determined point.

Further features of the present invention will become apparent from the following description of exemplary embodiments with reference to the attached drawings.

BRIEF DESCRIPTION OF THE DRAWINGS

FIG. 11A is a sectional view showing a section of a joined chip region after the first substrate and the second substrate are joined;

FIG. 11B is a sectional view showing a section of a joined chip region after the first substrate and the second substrate are joined;

DESCRIPTION OF THE EMBODIMENTS

Figure 1A:
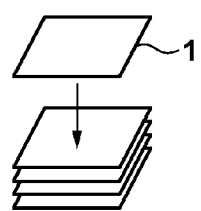
FIG. 1A is a view for explaining a method of manufacturing a semiconductor device by overlaying a plurality of substrates.

Exemplary embodiments of the present invention will be described below with reference to the accompanying drawings. Note that the same reference numerals denote the same members throughout the drawings, and a repetitive description thereof will not be given.

Figure 1B:
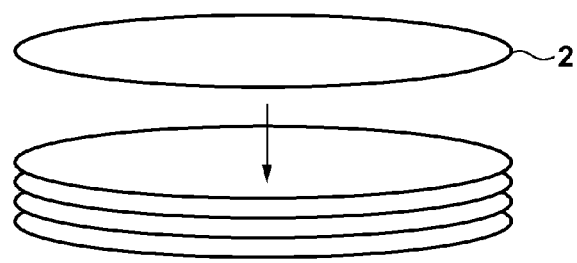
FIG. 1B is a view for explaining a method of manufacturing a semiconductor device by overlaying a plurality of substrates.

A method of manufacturing a semiconductor device by overlaying a plurality of substrates each including a circuit pattern includes a Chip-To-Chip method and a Wafer-To-Wafer method. The Chip-To-Chip method overlays and joins non-defective chips 1 after dicing, as shown in FIG. 1A. On the other hand, the Wafer-To-Wafer method overlays and joins substrates 2, as shown in FIG. 1B, and then performs dicing. The present invention is applicable to both methods. In the following embodiments, examples using the Wafer-To-Wafer method will be described.

<First Embodiment>

In the first embodiment, a method of forming, in a second substrate joined on a first substrate including an electrode pad, a through electrode to electrically connect a pattern formed on the second substrate and the electrode pad of the first substrate will be described. First, the outline of the method of forming a through electrode will be explained. A resist pattern is formed on a surface (a second surface on the opposite side of the first surface that is in contact with the first substrate) of the second substrate by a lithography apparatus. After that, an etching process is performed using the resist pattern as an etching mask, thereby forming a through hole that penetrates the second substrate. The through hole is filled with an electrical conducting material such as a metal, thereby forming a through electrode. As the lithography apparatus, for example, an exposure apparatus that transfers the pattern of an original to a substrate, an imprint apparatus that forms an imprint material on a substrate using a mold, or a drawing apparatus that forms a pattern on a substrate using charged particle beams. In this embodiment, an example in which an exposure apparatus is used as the lithography apparatus will be described.

Figure 2:
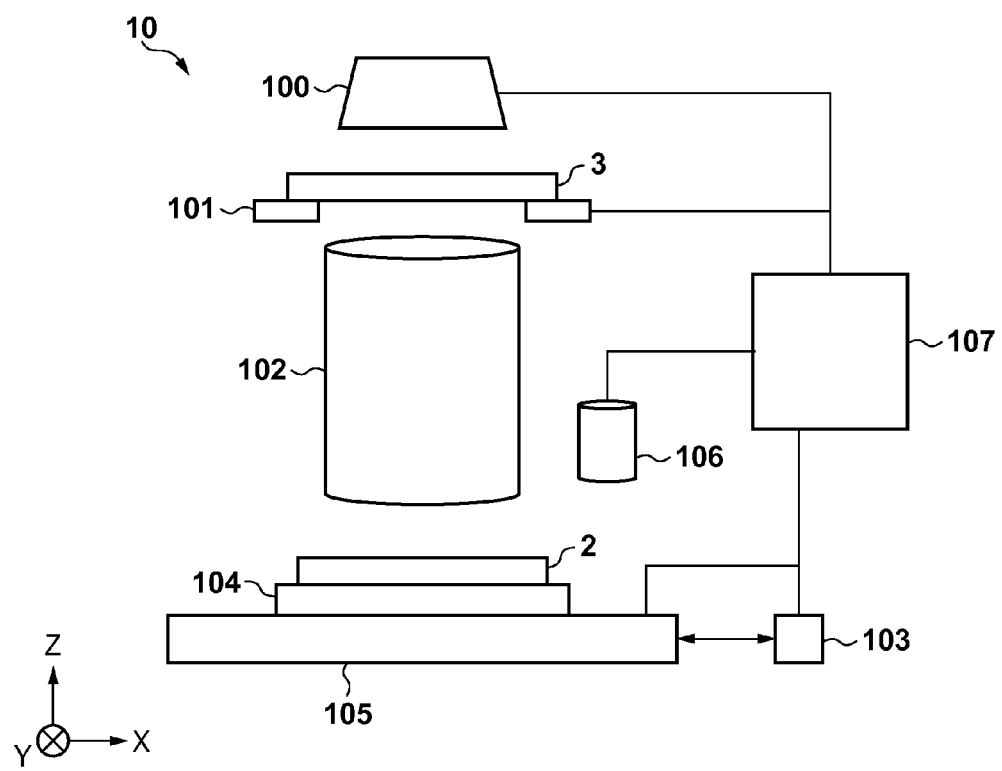
FIG. 2 is a schematic view showing the arrangement of an exposure apparatus.

An exposure apparatus 10 used in this embodiment will be explained with reference to FIG. 2. FIG. 2 is a schematic view showing the arrangement of the exposure apparatus 10. The exposure apparatus 10 can include, for example, an illumination optical system 100, a mask stage 101, a projection optical system 102, a substrate chuck 104, a substrate stage 105, a position measuring unit 103, an alignment detection unit 106, and a control unit 107. The control unit 107 includes, for example, a CPU, a memory, and the like, and controls a process of transferring a pattern formed on a mask 3 to a substrate 2 (process of exposing the substrate 2).

The illumination optical system 100 evenly illuminates the mask 3 held on the mask stage 101 using light emitted from a light source (not shown). The projection optical system 102 has a predetermined magnification (for example, ½×), and projects the pattern formed on the mask 3 to the substrate 2. The substrate chuck 104 holds the substrate 2. The substrate stage 105 is configured to mechanically hold the substrate chuck 104 and move in directions (X and Y directions) perpendicular to the optical axis of the projection optical system 102. The position measuring unit 103 includes, for example, a laser interferometer and measures the position of the substrate stage 105. The laser interferometer irradiates a reflecting plate (not shown) provided on the substrate stage 105 with a laser beam, and detects the displacement of the substrate stage 105 from a reference position based on the laser beam reflected by the reflecting plate. The position measuring unit 103 acquires the current position of the substrate stage 105 based on the displacement detected by the laser interferometer. The alignment detection unit 106 detects the positions of marks (alignment marks) formed on the substrate 2. In the first embodiment, the alignment detection unit 106 detects the positions of marks formed on the first substrate and the positions of marks formed on the second substrate using light such as infrared light transmitted through the second substrate in a state in which the first substrate and the second substrate are joined. The control unit 107 controls the projection magnification of the projection optical system 102 or the movement of the substrate stage 105 based on the positions of the first marks and those of the second marks detected by the alignment detection unit 106, thereby controlling alignment between the mask 3 and the substrate 2.

Figure 3:
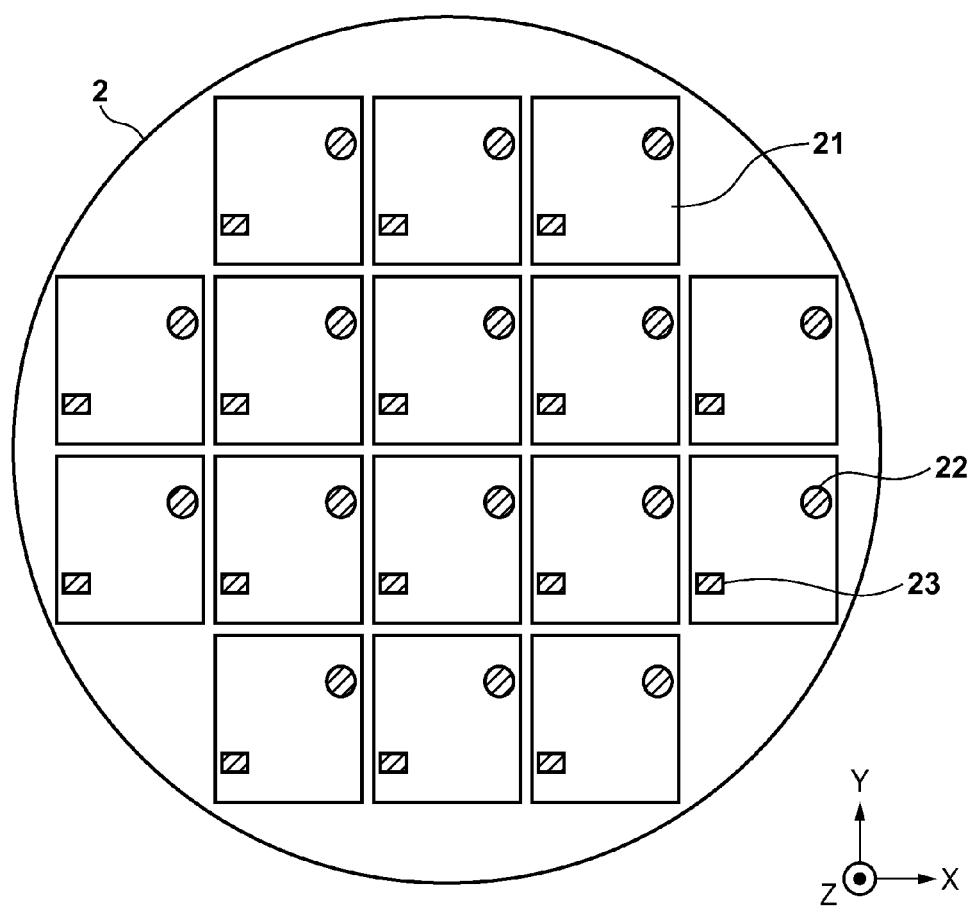
FIG. 3 is a schematic view showing one substrate on which a circuit pattern is formed.
Figure 4:
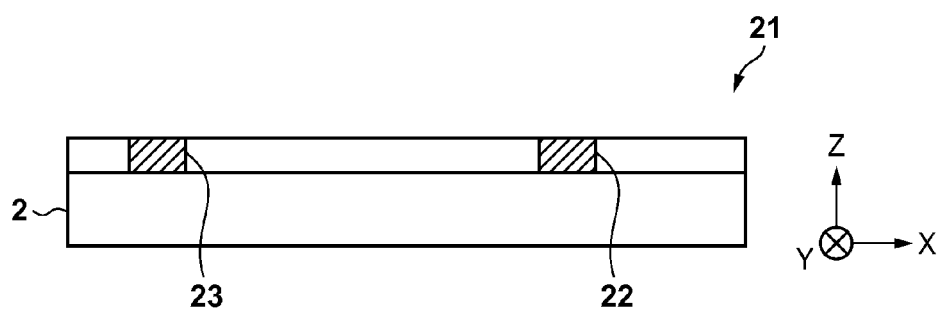
FIG. 4 is a sectional view showing a section of one chip region.

FIG. 3 is a schematic view showing one substrate 2 (for example, first substrate) on which a circuit pattern is formed. A plurality of chip regions 21 are formed on the substrate 2 in a preceding process. A mark 22 and an electrode pad 23, which are used in alignment of a process later, are formed in each chip region 21. In FIG. 3, one mark 22 is provided in each chip region 21. However, the present invention is not limited to this, and a plurality of marks 22 may be provided in each chip region 21. For the descriptive convenience, FIG. 3 illustrates only the electrode pad 23 to be connected to a through electrode as a circuit pattern formed in each chip region. FIG. 4 is a sectional view showing a section of one chip region 21. In the chip region 21, the mark 22 and the electrode pad 23 are formed on the substrate 2, as shown in FIG. 4.

The exposure apparatus 10 causes the alignment detection unit 106 to detect the position of the mark 22 in each of the plurality of chip regions 21 formed on the substrate 2. The exposure apparatus 10 causes the control unit 107 to calculate the position error, rotation error, and magnification error of the entire substrate from the position of the mark 22 in each of the plurality of chip regions 21. The exposure apparatus 10 controls the projection magnification of the projection optical system 102 or the movement of the substrate stage 105 based on the thus calculated position error, rotation error, and magnification error, thereby aligning the substrate 2 and the mask 3 such that the errors fall within allowable ranges. If a plurality of marks 22 are formed in each chip region 21, the exposure apparatus 10 causes the alignment detection unit 106 to detect the positions of the plurality of marks 22 in each chip region 21. This makes it possible to individually calculate the position error, rotation error, and magnification error of each chip region 21.

Example 1

Figure 5:
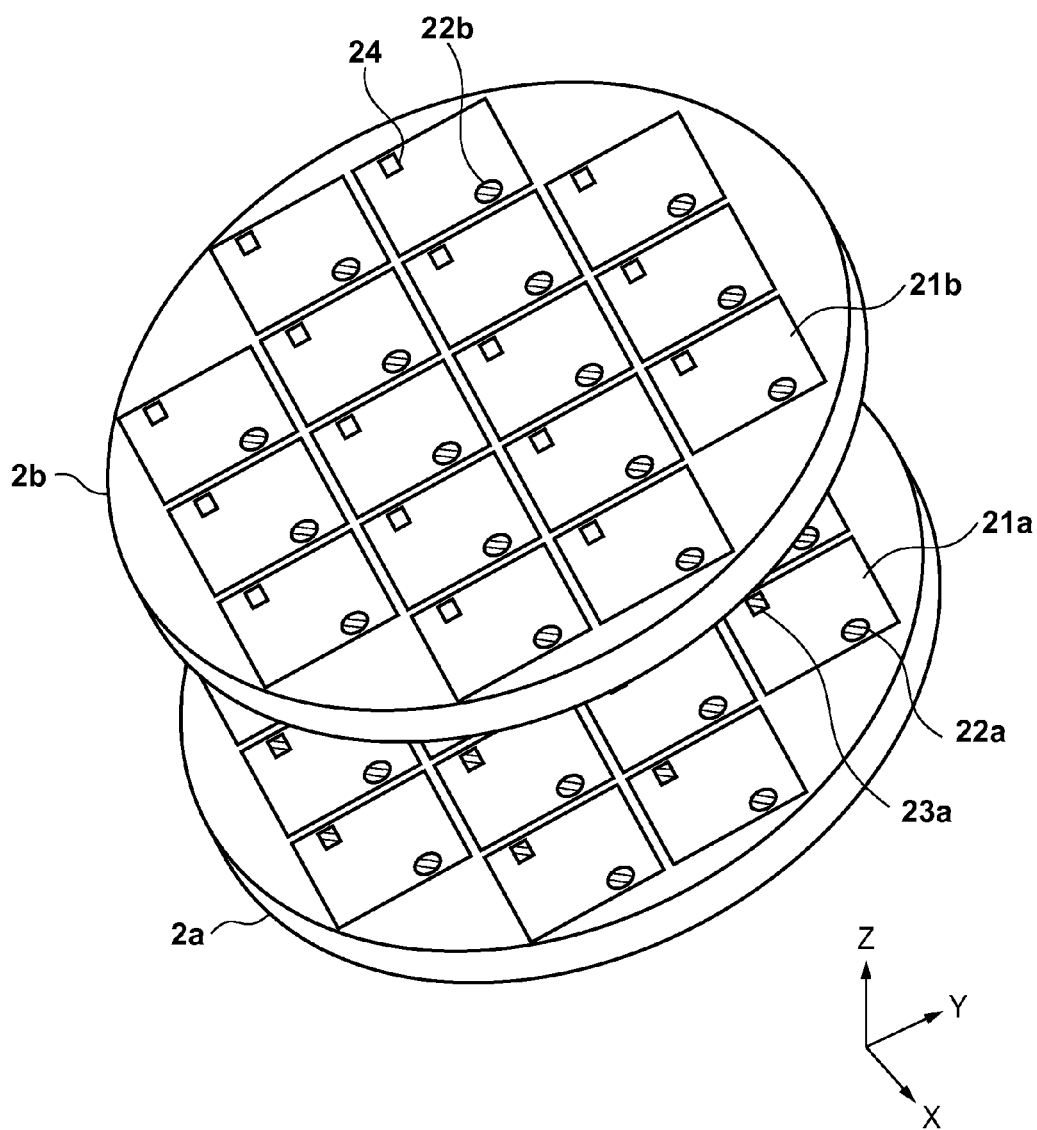
FIG. 5 is a view showing an example in which a second substrate is overlaid on a first substrate.

An example in which a plurality of substrates 2 each including a circuit pattern are overlaid and joined will be described. An example will be described here in which two substrates 2 (first substrate 2a and second substrate 2b) each including a plurality of chip regions 21 of the same size are overlaid and joined. FIG. 5 is a view showing an example in which the second substrate 2b is overlaid on the first substrate 2a. The plurality of chip regions 21 (to be referred to as first chip regions 21a hereinafter) each including a mark (first mark 22a) and an electrode pad 23a as a circuit pattern are formed on the first substrate 2a. The plurality of chip regions 21 (to be referred to as second chip regions 21b hereinafter) each including a mark (second mark 22b) as a circuit pattern are formed on the second substrate 2b. The second substrate 2b is overlaid and joined on the first substrate 2a such that the surface (first surface) on the opposite side of the surface (second surface) with the circuit pattern comes into contact with the first substrate 2a. A region where the first chip region 21a and the second chip region 21b are overlaid by joining the first substrate 2a and the second substrate 2b will be referred to as a joined chip region 25. FIG. 5 illustrates predetermined points 24 on the second surface of the second substrate 2b at which through electrodes should be formed if no position deviation occurs between the first substrate 2a and the second substrate 2b. The predetermined points 24 are determined based on the positions of the second marks 22b. No mark or the like is provided at each predetermined point 24. A pattern (electrical conducting layer) can be formed while being positioned based on the position of the second mark 22b after formation of the through electrode.

Figure 6A:
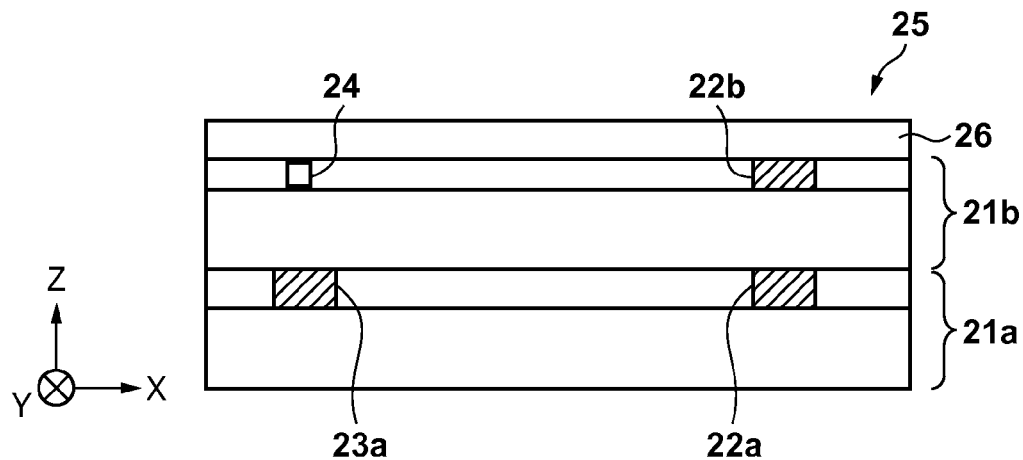
FIG. 6A is a sectional view showing a section of a joined chip region after the first substrate and the second substrate are joined.
Figure 6B:
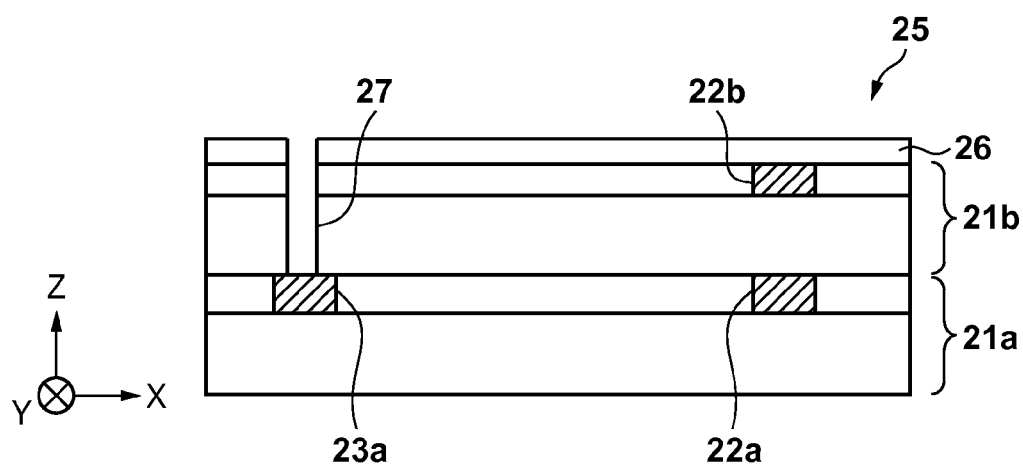
FIG. 6B is a sectional view showing a section of a joined chip region after the first substrate and the second substrate are joined.

A method of forming a through electrode in the second chip region 21b after the first substrate 2a and the second substrate 2b are overlaid and joined will be described. FIGS. 6A and 6B are sectional views showing a section of the joined chip region 25 after the first substrate 2a and the second substrate 2b are joined. As described above, the first mark 22a and the electrode pad 23a are formed in the first chip region 21a of the first substrate 2a, and the second mark 22b is formed in the second chip region 21b of the second substrate 2b. As shown in FIG. 6A, if no position deviation occurs between the first chip region 21a and the second chip region 21b, the control unit 107 causes the alignment detection unit 106 to detect the position of the second mark 22b, and determines the predetermined point 24 based on the position of the second mark 22b. The control unit 107 performs an exposure process for a resist 26 supplied to the second chip region 21b only at the predetermined point 24. The resist at the predetermined point 24 that has undergone the exposure process is removed by a development process, and a resist pattern having an opening only at the predetermined point 24 is formed. When the etching process is performed using the resist pattern as an etching mask, a through hole 27 communicating with the electrode pad 23a in the first chip region 21a can be formed in the second chip region 21b of the second substrate 2b, as shown in FIG. 6B. The through hole 27 formed in the second chip region 21b is filled with an electrical conducting material such as a metal, thereby forming a through electrode.

Figure 7A:
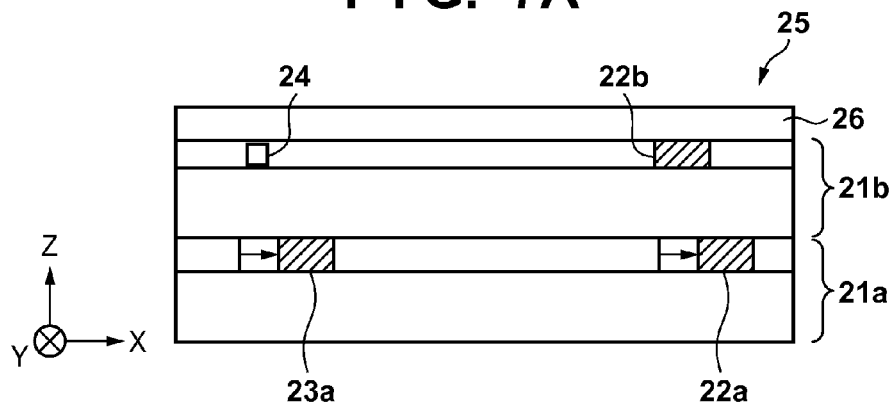
FIG. 7A is a sectional view showing a step of forming a through electrode in the second substrate when a position deviation of circuit pattern occurs between a first chip region and a second chip region.
Figure 7B:
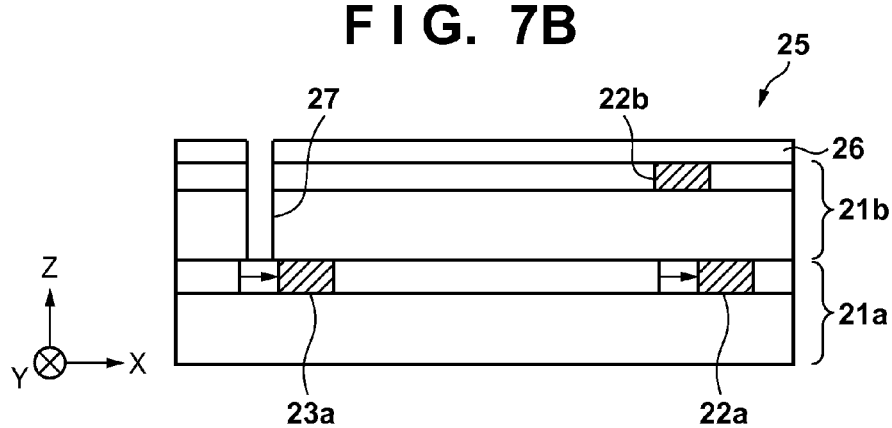
FIG. 7B is a sectional view showing a step of forming a through electrode in the second substrate when a position deviation of circuit pattern occurs between a first chip region and a second chip region.
Figure 7C:
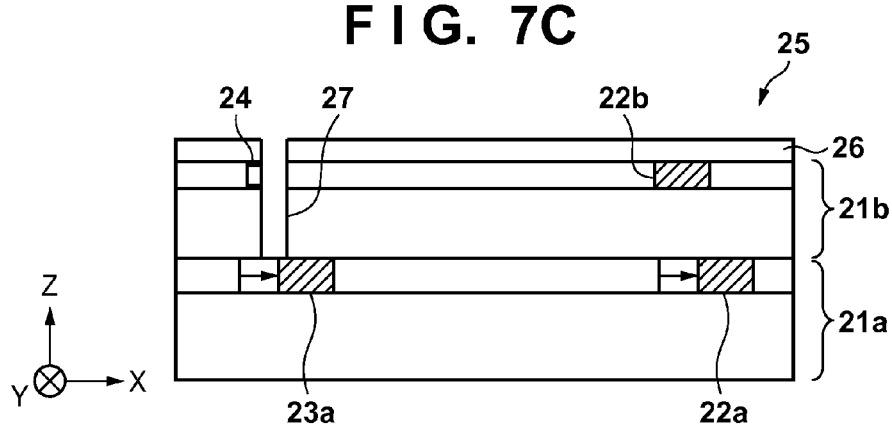
FIG. 7C is a sectional view showing a step of forming a through electrode in the second substrate when a position deviation of circuit pattern occurs between a first chip region and a second chip region.

However, when overlaying and joining a plurality of substrates 2, a position deviation of circuit pattern may occur between the plurality of substrates due to an overlay error between the plurality of substrates, deformation of the substrates caused by joint stress, and the like. FIGS. 7A to 7C are sectional views showing a step of forming a through electrode in the second substrate 2b when a position deviation of circuit pattern occurs between the first chip region 21a and the second chip region 21b. Assume that a position deviation of circuit pattern occurs between the first chip region 21a and the second chip region 21b, as shown in FIG. 7A. In this case, for example, if the predetermined point 24 is determined based on the second mark 22b formed on the second substrate 2b, and the through hole 27 is formed at the predetermined point 24, the through hole 27 may fail in communicating with the electrode pad 23a in the first chip region 21a, as shown in FIG. 7B. That is, the through electrode formed by filling the through hole 27 with an electrical conducting material may fail in coming into electrical contact with the electrode pad 23a. In this case, it is impossible to electrically connect the electrode pad 23a in the first chip region 21a and the pattern (electrical conducting layer) formed on the second substrate 2b.

The exposure apparatus 10 according to the first embodiment obtains the position deviation amount between the first chip region 21a (first substrate 2a) and the second chip region 21b (second substrate 2b) based on the position of the first mark 22a and the position of the second mark 22b detected by the alignment detection unit 106. Based on the obtained position deviation amount, the exposure apparatus 10 determines the point to form the through electrode so as to bring the pattern formed on the second substrate 2b into electrical contact with the electrode pad 23a in the first chip region 21a, and performs the exposure process for that point. The resist 26 at the point that has undergone the exposure process is removed by the development process, and a resist pattern having an opening only at the point is formed. When the etching process is performed using the resist pattern as an etching mask, the through hole 27 communicating with the electrode pad 23a in the first chip region 21a can be formed in the second chip region 21b, as shown in FIG. 7C. The through hole 27 formed in the second chip region 21b is filled with an electrical conducting material such as a metal, thereby forming a through electrode in contact with the electrode pad 23a in the first chip region 21a.

Figure 8:
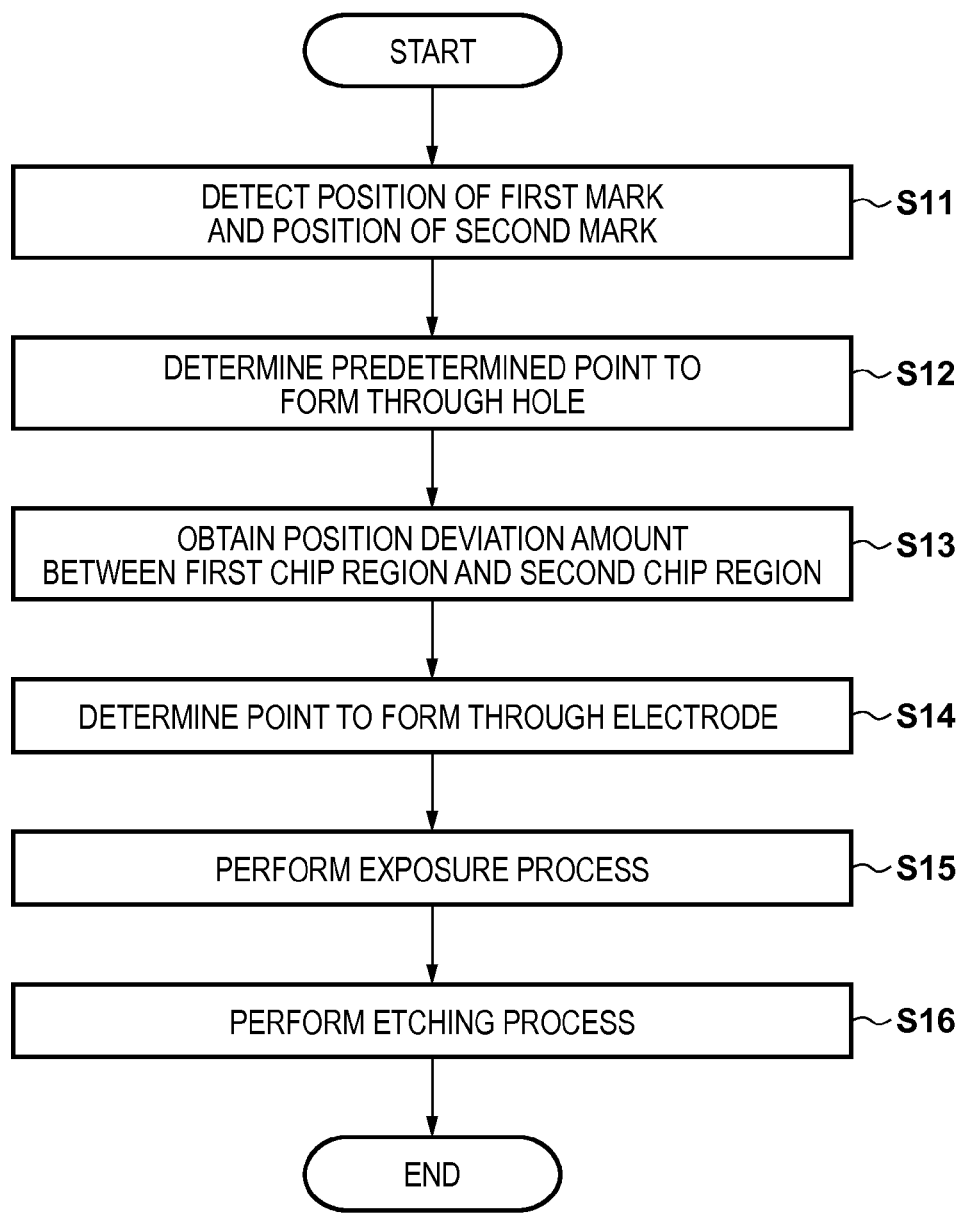
FIG. 8 is a flowchart showing a method of forming a through hole in the second chip region.

A method of forming the through hole 27 in the second chip region 21b will be described next with reference to a flowchart. FIG. 8 is a flowchart showing a method of forming a through hole 27 in the second chip region 21b. In step S11, the alignment detection unit 106 of the exposure apparatus 10 detects the position of the first mark 22a and the position of the second mark 22b. For example, each of the position of the first mark 22a and the position of the second mark 22b detected by the alignment detection unit 106 is represented by a distance for the origin of the device coordinate system. The position of the first mark 22a will be referred to as $\Delta D_1$, and the position of the second mark 22b as $\Delta D_2$ hereinafter. In step S12, the control unit 107 of the exposure apparatus 10 determines, based on the position $\Delta D_2$ of the second mark 22b detected in step S11, the predetermined point 24 at which the through hole 27 should be formed if no position deviation occurs between the first chip region 21a and the second chip region 21b. The predetermined point 24 determined here has position deviations in the in the X and Y directions with respect to the electrode pad 23a in the first chip region 21a, as shown in FIG. 7A.

In step S13, the control unit 107 of the exposure apparatus 10 obtains the position deviation amount between the first chip region 21a and the second chip region 21b based on the position $\Delta D_1$ of the first mark 22a and the position $\Delta D_2$ of the second mark 22b. The position deviation amount is obtained by, for example, $\Delta D_1 + \Delta D_2$. In step S14, the control unit 107 of the exposure apparatus 10 determines, based on the position deviation amount between the first chip region 21a and the second chip region 21b, the point to form the through electrode so as to electrically connect the electrode pad 23a and the pattern formed on the second substrate 2b. The point to form the through electrode is determined to be a point shifted from the predetermined point 24 determined in step S12 based on the position deviation amount obtained in step S13. As the shift amount from the predetermined point 24, a half of the position deviation amount is used. In this case, a shift amount $\Delta D$ from the predetermined point 24 is obtained by $\Delta D = (\Delta D_1 + \Delta D_2)/2$. As the shift amount from the predetermined point 24, an amount obtained by multiplying each of the position deviation amount by each weight based on the ratio of the size of the pattern formed on the second substrate 2b to that of the electrode pad 23a in the first chip region 21a may be used. In this case, for example, if the electrode pad 23a in the first chip region 21a has a size twice larger than that of the pattern formed on the second substrate 2b, the shift amount $\Delta D$ from the predetermined point 24 is obtained by $\Delta D = \Delta D_1 \times (1/3) + \Delta D_2 \times (2/3)$.

In step S15, the exposure apparatus 10 performs the exposure process for the point determined in step S14. And, a development apparatus performs a development process for the resist 26 that has undergone the exposure process. A resist pattern having an opening at the point determined in step S14 can thus be formed in the second chip region 21b. In step S16, an etching apparatus performs an etching process using the resist pattern formed in step S15 as an etching mask. The through hole 27 communicating with the electrode pad 23a in the first chip region 21a can thus be formed in the second chip region 21b, as shown in FIG. 7C. When the through hole 27 is formed in accordance with the flowchart of FIG. 8, the electrode pad 23a in the first chip region 21a and the pattern formed on the second substrate 2b can electrically be connected via the through electrode formed by filling the through hole 27 with an electrical conducting material.

If the positions of a plurality of marks 22 are detected in one joined chip region 25, a rotation deviation $\Delta D_{rot}$ and a magnification deviation $\Delta D_{mag}$ can be obtained as the shift amounts from the predetermined point 24 in the joined chip region 25. For example, the alignment detection unit 106 detects the positions ($\Delta D_{b1}$, $\Delta D_{b2}$, $\Delta D_{b3}$ . . . ) of the first marks 22a ($b_1$, $b_2$, $b_3$ . . . ) provided in each first chip region 21a of the first substrate 2a. A coefficient is obtained from the positions of the first marks 22a by the least-square approximation method, and a rotation deviation $\Delta D_{b\_rot}$ and a magnification deviation $\Delta D_{b\_mag}$ of each first chip region 21a of the first substrate 2a are calculated. In a similar manner, the second marks 22b $t_2$, $t_3$ . . . ) provided in each second chip region 21b of the second substrate 2b are detected. A coefficient is obtained from the positions of the second marks 22b by the least-square approximation method, and a rotation deviation $\Delta D_{t\_rot}$ and a magnification deviation $\Delta D_{t\_mag}$ of each second chip region 21b of the second substrate 2b are calculated.

If the size of the pattern formed on the second substrate 2b and that of the electrode pad 23a in the first chip region 21a are almost the same, the rotation deviation $\Delta D_{rot}$ of the joined chip region 25 can be obtained by $\Delta D_{rot} = (\Delta D_{b\_rot} + \Delta D_{t\_rot})/2$. Similarly, the magnification deviation $\Delta D_{mag}$ of the joined chip region 25 can be obtained by $\Delta D_{mag} = (\Delta D_{b\_mag} + \Delta D_{t\_mag})/2$. Alternatively, assume that, for example, the size of the electrode pad 23a in the first chip region 21a is twice larger than that of the pattern formed on the second substrate 2b. In this case, the rotation deviation $\Delta D_{rot}$ of the joined chip region 25 can be obtained by $\Delta D_{rot} = \Delta D_{b\_rot} \times (1/3) + \Delta D_{t\_rot} \times (2/3)$. Similarly, the magnification deviation $\Delta D_{mag}$ of the joined chip region 25 can be obtained by $\Delta D_{mag} = \Delta D_{d\_mag} \times (1/3) + \Delta D_{t\_mag} \times (2/3)$.

As described above, if a rotation deviation occurs between the first chip region 21a and the second chip region 21b, the exposure process is performed after rotating the substrate only by the above-described rotation deviation $\Delta D_{rot}$. If a magnification deviation occurs between the first chip region 21a and the second chip region 21b, the exposure process is performed after changing the projection magnification of the projection optical system 102 only by the above-described magnification deviation $\Delta D_{mag}$.

Example 2

Figure 9A:
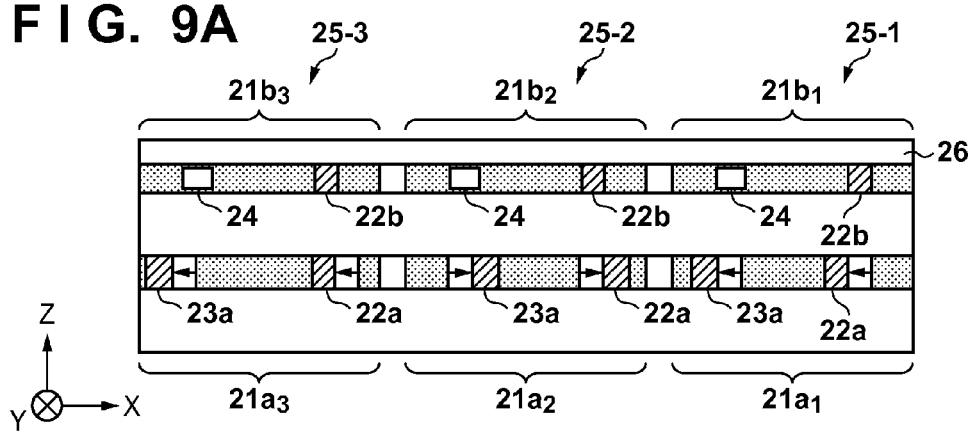
FIG. 9A is a sectional view showing sections of a plurality of joined chip regions after a first substrate and a second substrate are overlaid and joined.
Figure 9B:
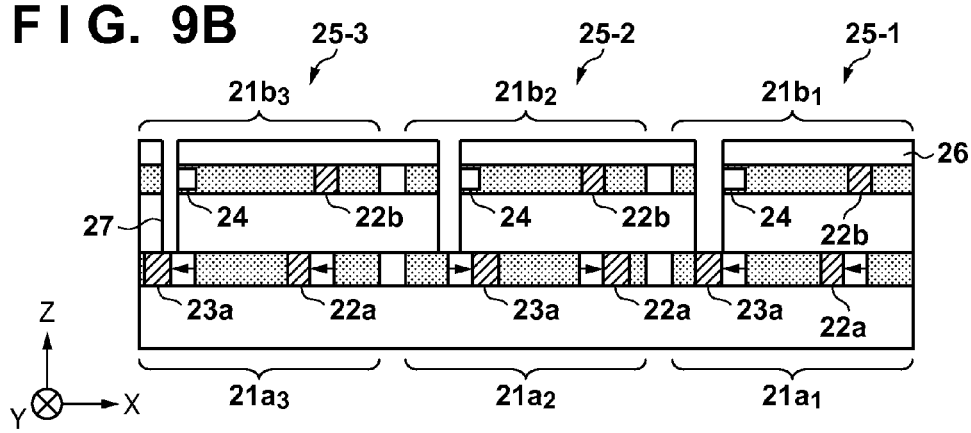
FIG. 9B is a sectional view showing sections of a plurality of joined chip regions after a first substrate and a second substrate are overlaid and joined.
Figure 9C:
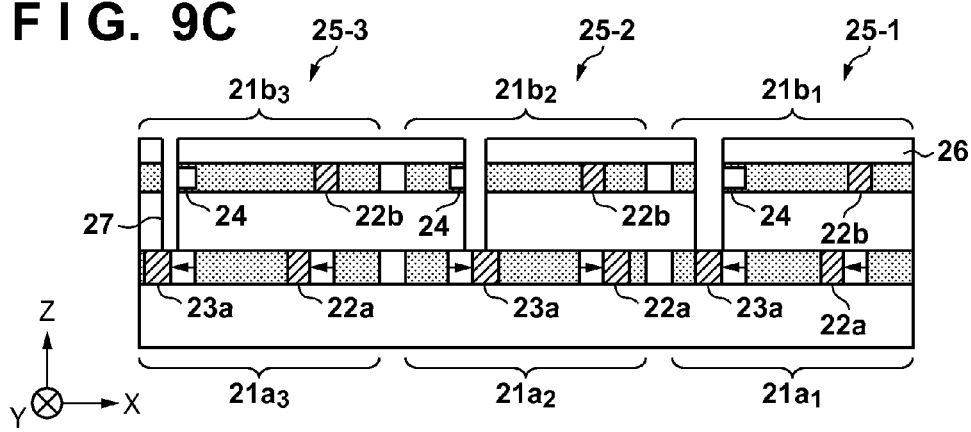
FIG. 9C is a sectional view showing sections of a plurality of joined chip regions after a first substrate and a second substrate are overlaid and joined.

A method of forming a through electrode in the second substrate 2b when different position deviations of circuit pattern have occurred between the plurality of joined chip regions 25 after joining the first substrate 2a and the second substrate 2b will be described. FIGS. 9A to 9C are sectional views showing sections of a plurality of (three) joined chip regions 25-1 to 25-3 after the first substrate 2a and the second substrate 2b are overlaid and joined. As shown in FIG. 9A, the joined chip region 25-1 has a first chip region 21$a_1$ and a second chip region 21$b_1$, and the first chip region 21$a_1$ has a position deviation in the −X direction with respect to the second chip region 21$b_1$. Similarly, the joined chip region 25-3 has a first chip region 21$a_3$ and a second chip region 21$b_3$, and the first chip region 21$a_3$ has a position deviation in the −X direction with respect to the second chip region 21$b_3$. On the other hand, the joined chip region 25-2 has a first chip region 21$a_2$ and a second chip region 21$b_2$, and the first chip region 21$a_2$ has a position deviation in the +X direction with respect to the second chip region 21$b_2$.

In this situation, assume a case where points to form through electrodes are determined based on the position deviation amount between the first chip region 21$a_1$ and the second chip region 21$b_1$ and the position deviation amount between the first chip region 21$a_3$ and the second chip region 21$b_3$. In this case, in the joined chip regions 25-1 and 25-3, a through electrode can be formed so as to electrically connect the pattern formed in the second chip region 21b and the electrode pad 23a in the first chip region 21a, as shown in FIG. 9B. In the joined chip region 25-2, however, a through electrode is formed at a point shifted in a direction reverse to the direction of the position deviation between the first chip region 21$a_2$ and the second chip region 21$b_2$. It is therefore impossible to electrically connect the pattern formed in the second chip region 21$b_2$ and the electrode pad 23a in the first chip region 21$a_2$ via the through electrode. That is, in such a case, if the through electrodes are formed by obtaining the position error of the entire substrate or the like from the position deviation amount of each joined chip region 25, a joined chip region where the electrode pad 23a and the pattern formed in the second chip region 21b are not electrically connected can exist. Hence, for the substrate 2 in which the position deviations occur in different directions between the plurality of joined chip regions 25, the number of joined chip regions 25 to perform alignment measurement is increased to calculate not only errors of 1st-order components such as a position error, rotation error, and magnification error but also errors of higher-order components. Alternatively, alignment measurement is performed for all joined chip regions 25, and a position error and the like are obtained for each joined chip region 25 to form a through electrode. This makes it possible to form the through electrodes so as to connect the pattern formed in the second chip region 21b and the electrode pad 23a in the first chip region 21a in all joined chip regions 25, as shown in FIG. 9C.

<Second Embodiment>

Figure 10:
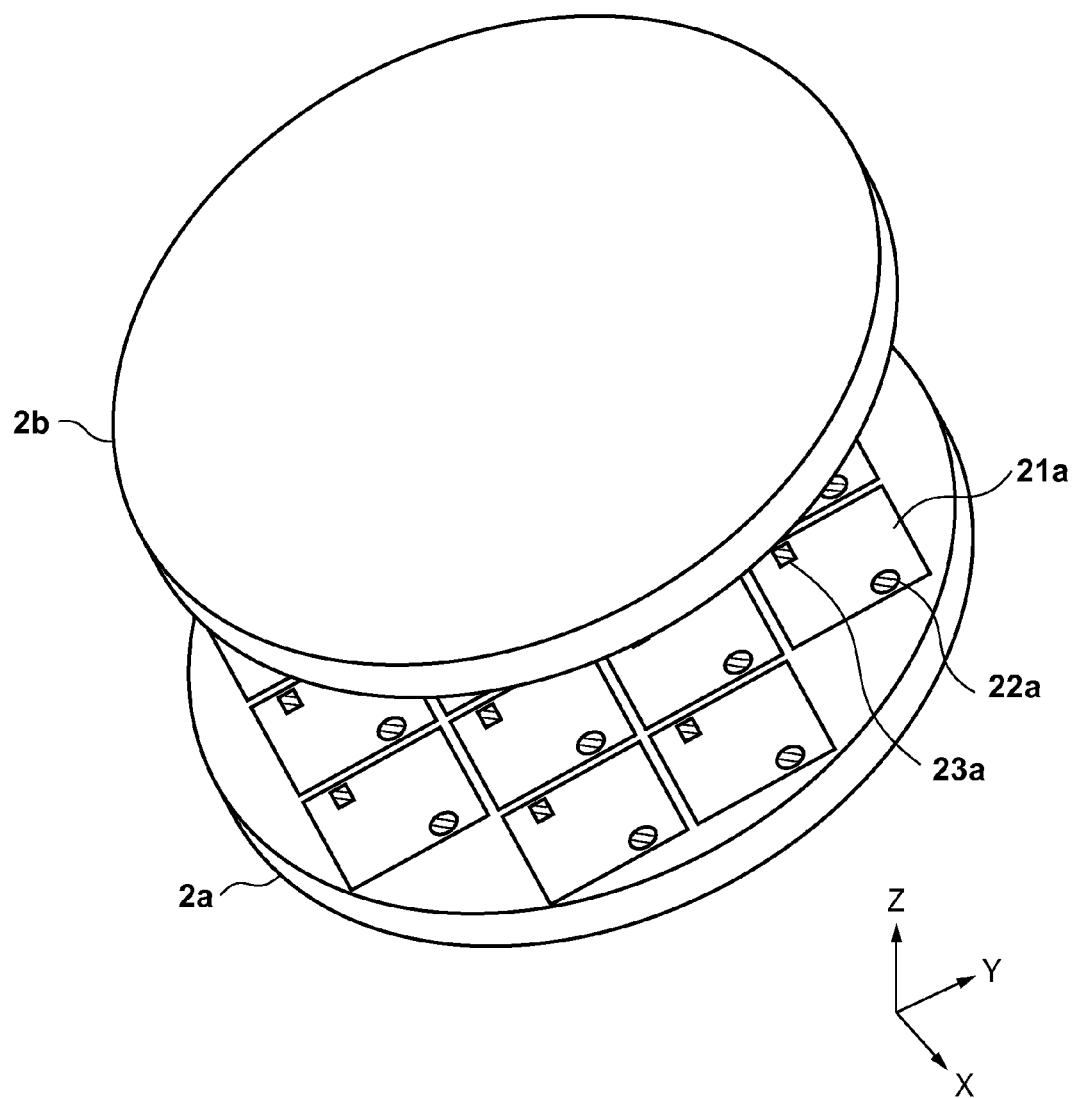
FIG. 10 is a view showing an example in which a second substrate is overlaid on a first substrate.

In the second embodiment, an example will be described in which a second substrate 2b is overlaid and joined on a first substrate 2a such that a surface of the first substrate 2a with a circuit pattern comes into contact with a surface of the second substrate 2b with a circuit pattern. FIG. 10 is a view showing an example in which the second substrate 2b is overlaid on the first substrate 2a. A plurality of chip regions 21 (to be referred to as first chip regions 21a hereinafter) each including a first mark 22a and an electrode pad (first electrode pad 23a) as a circuit pattern are formed on the first substrate 2a. A plurality of chip regions 21 (to be referred to as second chip regions 21b hereinafter) each including a second mark 22b and an electrode pad (second electrode pad 23b) as a circuit pattern are formed on the second substrate 2b. The second substrate 2b is overlaid and joined on the first substrate 2a such that the surface (first surface) with the circuit pattern comes into contact with the first substrate 2a.

A method of forming a through electrode in the second chip region 21b after the first substrate 2a and the second substrate 2b are overlaid and joined will be described next. FIGS. 11A and 11B are sectional views showing a section of a joined chip region 25 after the first substrate 2a and the second substrate 2b are joined. As described above, the first mark 22a and the first electrode pad 23a are formed in the first chip region 21a of the first substrate 2a. The second mark 22b and the second electrode pad 23b are formed in the second chip region 21b of the second substrate 2b. FIGS. 11A and 11B illustrates predetermined points 24a and 24b on the second surface on the opposite side of the first surface of the second substrate 2b at which through electrodes should be formed if no position deviation occurs between the first substrate 2a and the second substrate 2b. No marks or the like are provided at the predetermined points 24a and 24b. A pattern (electrical conducting layer) can be formed while being positioned based on the position of the first mark 22a or the position of the second mark 22b after formation of the through electrodes.

For example, assume a case where no position deviation occurs between the first chip region 21a and the second chip region 21b. In this case, an exposure apparatus 10 (control unit 107) causes an alignment detection unit 106 to detect one of the position of the first mark 22a and the position of the second mark 22b, and determines the predetermined points 24a and 24b based on the detection result, as shown in FIG. 11A. The control unit 107 performs an exposure process for a resist 26 supplied to the second chip region 21b only at the predetermined points 24a and 24b. The exposure process at the predetermined points 24a and 24b can be performed using one mask. The resist 26 at the predetermined points 24a and 24b that has undergone the exposure process is removed by a development process, and a resist pattern having openings only at the predetermined points 24a and 24b is formed. When an etching process is performed using the resist pattern as an etching mask, a through hole communicating with the first electrode pad 23a and a through hole communicating with the second electrode pad 23b can be formed in the second chip region 21b of the second substrate 2b. The through holes formed in the second chip region 21b are filled with an electrical conducting material such as a metal, thereby forming through electrodes.

However, when overlaying and joining a plurality of substrates 2, a position deviation of circuit pattern may occur between the plurality of substrates due to an overlay error between the plurality of substrates, deformation of the substrates 2 caused by joint stress, and the like. Assume a case where in a state in which such a position deviation has occurred, the predetermined points 24a and 24b are determined based on, for example, the second mark 22b, and through electrodes are formed at the determined predetermined points 24a and 24b. In this case, although the through electrode formed at the predetermined point 24b comes into contact with the second electrode pad 23b, the through electrode formed at the predetermined point 24a may fail in coming into contact with the first electrode pad 23a. Similarly assume a case where the predetermined points are determined based on the first mark 22a, and through electrodes are formed at the predetermined points. In this case, although the through electrode formed at the predetermined point 24a comes into contact with the first electrode pad 23a, the through electrode formed at the predetermined point 24b may fail in coming into contact with the second electrode pad 23b.

In the second embodiment, the exposure apparatus 10 obtains the position deviation amount between the first chip region 21a (first substrate 2a) and the second chip region 21b (second substrate 2b) based on the position of the first mark 22a and the position of the second mark 22b detected by the alignment detection unit 106. Based on the obtained position deviation amount, the exposure apparatus 10 determines the points to form the through electrodes so as to bring the pattern formed on the second substrate 2b into electrical contact with the first electrode pad 23a and the second electrode pad 23b, and performs the exposure process for the points. The resist 26 at the points that has undergone the exposure process is removed by the development process, and a resist pattern having openings only at the points is formed. When the etching process is performed using the resist pattern as an etching mask, a through hole 27a communicating with the first electrode pad 23a and a through hole 27b communicating with the second electrode pad 23b can be formed in the second chip region 21b, as shown in FIG. 11B. The through holes 27a and 27b formed in the second chip region 21b are filled with an electrical conducting material such as a metal, thereby forming a through electrode in electrical contact with the first electrode pad 23a and a through electrode in electrical contact with the second electrode pad 23b.

For example, the alignment detection unit 106 of the exposure apparatus 10 detects a position $\Delta D_1$ of the first mark 22a and a position $\Delta D_2$ of the second mark 22b. The control unit 107 obtains the position deviation amount $(\Delta D_1 + \Delta D_2)$ between the first chip region 21a and the second chip region 21b. Based on the position deviation amount between the first chip region 21a and the second chip region 21b, the control unit 107 determines the points to form the through electrodes so as to electrically connect the pattern formed on the second substrate 2b to the first electrode pad 23a and the second electrode pad 23b. Each point to form a through electrode is determined to be a point shifted based on the position deviation amount from the predetermined point at which the through electrode should be formed if no position deviation occurs between the first chip region 21a and the second chip region 21b. As the shift amount from the predetermined point, a half of the position deviation amount or an amount obtained by multiplying the position deviation amount by the ratio of the size of the pattern formed on the second substrate 2b to that of the first electrode pad 23a (second electrode pad 23b) can be used, as in the first embodiment. The exposure process is performed for the thus determined points to form the through holes 27a and 27b, thereby forming the through electrode electrically connected to the first electrode pad 23a and the through electrode electrically connected to the second electrode pad 23b in the second chip region 21b. In the second embodiment, each point to form the through electrode is determined by shifting it from the predetermined point based on the position deviation amount. However, the present invention is not limited to this. For example, each point to form the through electrode may be determined by changing the projection magnification of a projection optical system 102 based on the position deviation amount or by both the shift amount from the predetermined point and the projection magnification of the projection optical system 102.

<Third Embodiment>

In the third embodiment, an example will be described in which a through electrode is formed in a substrate 2 including a first surface 20b with an electrode pad 29 and a second surface 20a with a pattern such that the electrode pad 29 on the first surface 20b and the pattern formed on the second surface 20a are electrically connected. A method of manufacturing the substrate 2 will be described first. After the electrode pad 29 and a first mark 30a are formed on the first surface 20b as a circuit pattern, the second surface 20a on the opposite side of the first surface 20b is polished to thin the substrate 2. In a state in which the substrate 2 is thin, it can become difficult to perform various processes including an exposure process for the substrate 2. Hence, an assisting member 31 (support substrate) configured to assist the substrate 2 is joined in contact with the first surface 20b of the substrate 2. A circuit pattern including a second mark 30b is formed on the second surface 20a of the substrate 2 to which the assisting member 31 is joined.

Figure 12A:
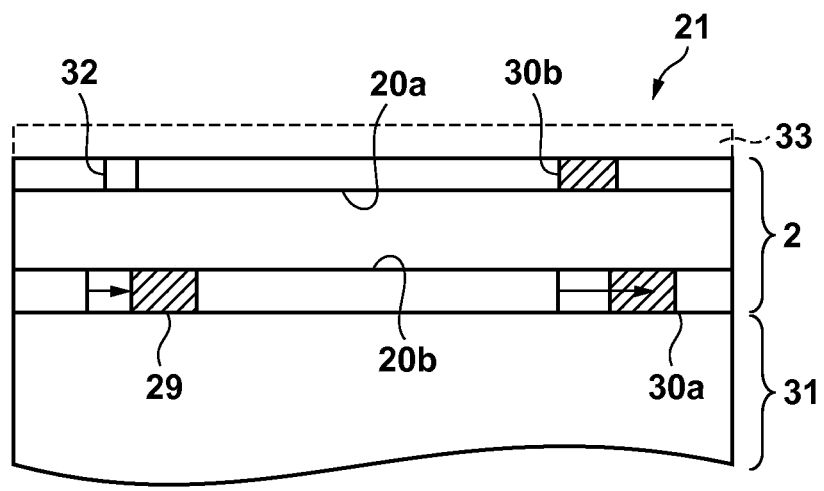
FIG. 12A is a sectional view showing a section of one chip region formed on a substrate.
Figure 12B:
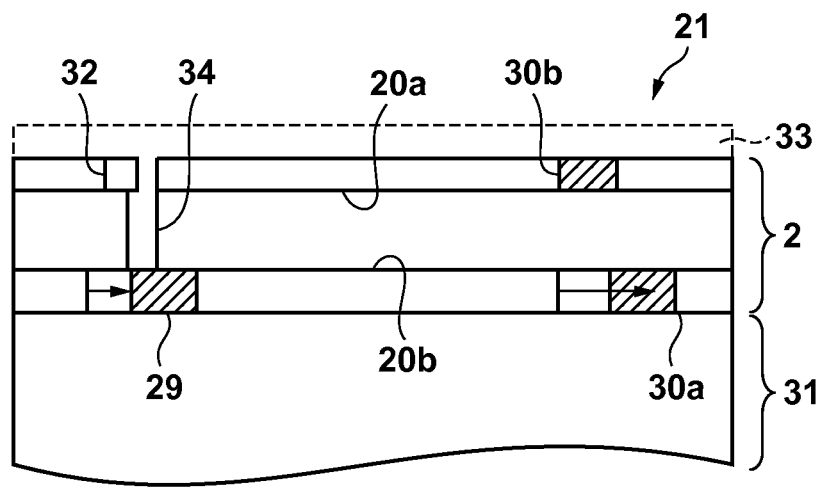
FIG. 12B is a sectional view showing a section of one chip region formed on a substrate.

A method of forming a through electrode in the substrate 2 including the first surface 20b and the second surface 20a each having a circuit pattern will be described next. FIGS. 12A and 12B are sectional views showing a section of one chip region 21 formed on the substrate 2. As described above, the first mark 30a and the electrode pad 29 are formed on the first surface 20b in the chip region 21, and the second mark 30b is formed on the second surface 20a. FIGS. 12A and 12B illustrate a predetermined point 32 on the second surface 20a at which a through electrode should be formed if no position deviation occurs between the first surface 20b and the second surface 20a. The predetermined point 32 is determined based on the position of the second mark 30b formed on the second surface 20a. However, no mark or the like is provided at the predetermined point 32. A pattern (electrical conducting layer) can be formed while being positioned based on the position of the second mark 30b after formation of the through electrode.

For example, when no position deviation of circuit pattern occurs between the first surface 20b and the second surface 20a, an exposure apparatus 10 (control unit 107) causes an alignment detection unit 106 to detect the position of the second mark 30b, and determines the predetermined point 32 based on the detection result. The control unit 107 performs an exposure process for a resist 33 supplied to the second surface 20a only at the predetermined point 32. The resist 33 at the predetermined point 32 that has undergone the exposure process is removed by a development process, and a resist pattern having an opening only at the predetermined point 32 is formed. When an etching process is performed using the resist pattern as an etching mask, a through hole communicating with the electrode pad 29 on the first surface 20b can be formed in the substrate 2. The through hole formed in the substrate 2 is filled with an electrical conducting material such as a metal, thereby forming a through electrode.

However, a position deviation of circuit pattern may occur between the first surface 20b and the second surface 20a due to an alignment error between the first surface 20b and the second surface 20a, deformation of the substrate 2 caused by joint stress when joining the substrate 2 to the assisting member 31, and the like. For this reason, when the predetermined point 32 is determined based on the position of the second mark 30b, and the through electrode is formed at the predetermined point 32, the through electrode may fail in coming into contact with the electrode pad 29 on the first surface 20b. In the third embodiment, the exposure apparatus 10 obtains the position deviation of circuit pattern between the first surface 20b and the second surface 20a based on the position of the first mark 30a and the position of the second mark 30b detected by the alignment detection unit 106. Based on the obtained position deviation amount, the exposure apparatus 10 determines the point to form the through electrode so as to bring the pattern formed on the second surface 20a into electrical contact with the electrode pad 29 on the first surface 20b.

For example, the alignment detection unit 106 of the exposure apparatus 10 detects a position $\Delta D_1$ of the first mark 30a and a position $\Delta D_2$ of the second mark 30b. The control unit 107 obtains the position deviation amount $(\Delta D_1 + \Delta D_2)$ between the first surface 20b and the second surface 20a. Based on the position deviation amount between the first surface 20b and the second surface 20a, the control unit 107 of the exposure apparatus determines the point to form the through electrode so as to electrically connect the pattern formed on the second surface 20a to the electrode pad 29 on the first surface 20b. The point to form the through electrode is determined to be a point shifted based on the position deviation amount from the predetermined point 32 at which the through electrode should be formed if no position deviation occurs between the first surface 20b and the second surface 20a. As the shift amount from the predetermined point 32, a half of the position deviation amount or an amount obtained by multiplying the position deviation amount by the ratio of the size of the pattern formed on the second surface 20a to that of the electrode pad 29 on the first surface 20b can be used, as in the first embodiment. The exposure process is performed for the thus determined point to form the through electrode, thereby forming a through hole 34 communicating with the electrode pad 29 on the first surface 20b, as shown in FIG. 12B. The through hole 34 is filled with an electrical conducting material such as a metal, thereby forming a through electrode electrically connected to the electrode pad 29.

<Embodiment of Method of Manufacturing Article>

A method of manufacturing an article according to an embodiment of the present invention is suitable to manufacture an article, for example, an electronic device such as a semiconductor device or an element having a microstructure. The method of manufacturing an article according to the embodiment includes a step of forming a through electrode in a substrate using the above-described through electrode forming method, and a step of processing the substrate in which the through electrode is formed in the preceding step. The manufacturing method also includes other known processes (oxidation, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-048070 filed on Mar. 11, 2014, which is hereby incorporated by reference herein in its entirety.

What is claimed is:

1. A method of forming a through electrode, in a second substrate joined on a first substrate having an electrode pad, such that a pattern to be formed on the second substrate is electrically connected to the electrode pad via the through electrode, the first substrate having a first mark, the second substrate having a second mark, the method comprising:

detecting a position of the first mark of the first substrate and a position of the second mark of the second substrate in a state in which the first substrate and the second substrate are joined, wherein the position of the first mark is detected through the second substrate using light transmitted through the second substrate;

determining, based on the position of the first mark and the position of the second mark detected in the detecting, a point to form the through electrode in the second substrate so as to electrically connect the pattern to the electrode pad; and forming the through electrode at the determined point.

2. The method according to claim 1, wherein in the determining, a position deviation amount between the first substrate and the second substrate is obtained based on the position of the first mark and the position of the second mark, and a position shifted from a predetermined point by a half of the position deviation amount is determined as the point to form the through electrode.

3. The method according to claim 1, wherein in the determining, a position deviation amount between the first substrate and the second substrate is obtained based on the position of the first mark and the position of the second mark, and a position shifted from a predetermined point by an amount obtained from a position deviation amount of the first mark, a position deviation amount of the second mark, a size of the pattern, and a size of the pad is determined as the point to form the through electrode.

4. The method according to claim 1,
wherein the second substrate includes a first surface joined on the first substrate, and a second surface opposite to the first surface, and
wherein the second mark is arranged on the second surface.

5. The method according to claim 4, further comprising forming the pattern on the second surface of the second substrate, wherein the pattern is positioned based on the position of the second mark.

6. The method according to claim 1,
wherein the second substrate includes a first surface joined on the first substrate, and a second surface opposite to the first surface,
wherein the second mark is arranged on the first surface, and
wherein the method further comprises forming the pattern on the second surface.

7. The method according to claim 6, wherein in the detecting, the position of the second mark is detected using light transmitted through the second substrate.

8. The method according to claim 7, wherein the pattern is positioned based on the position of the second mark.

9. A method of forming a through electrode, in a substrate including a first surface having an electrode pad and a second surface on which a pattern is to be formed, such that the pattern is electrically connected to the electrode pad via the through electrode, the first surface having a first mark, the second surface having a second mark, the method comprising:
detecting a position of the first mark of the first surface and a position of the second mark of the second surface, wherein the position of the first mark is detected through the substrate using light transmitted through the substrate;
determining, based on the position of the first mark and the position of the second mark detected in the detecting, a point to form the through electrode in the substrate so as to electrically connect the pattern to the electrode pad; and
forming the through electrode at the determined point.

10. The method according to claim 9, wherein an assisting member configured to assist the substrate is joined to the first surface.

11. A method of manufacturing an article, the method comprising steps of:
forming a through electrode, in a second substrate joined on a first substrate having an electrode pad such that a pattern to be formed on the second substrate is electrically connected to the electrode pad via the through electrode, the first substrate having a first mark, the second substrate having a second mark;
forming the pattern on the second substrate with the through electrode; and
processing the substrate with the through electrode and the pattern,
wherein the forming the through electrode includes:
detecting a position of the first mark of the first substrate and a position of the second mark of the second substrate in a state in which the first substrate and the second substrate are joined, wherein the position of the first mark is detected through the second substrate using light transmitted through the second substrate;
determining, based on the position of the first mark and the position of the second mark detected in the detecting, a point to form the through electrode in the second substrate so as to electrically connect the pattern to the electrode pad; and
forming the through electrode at the determined point.

12. A method of manufacturing an article, the method comprising steps of:
forming a through electrode in a substrate including a first surface having an electrode pad and a second surface, the first surface having a first mark, the second surface having a second mark;
forming a pattern on the second surface of the substrate such that the pattern is electrically connected to the electrode pad via the through electrode; and
processing the substrate with the through electrode and the pattern,
wherein the forming the through electrode includes:
detecting a position of the first mark of the first surface and a position of the second mark of the second surface, wherein the position of the first mark is detected through the substrate using light transmitted through the substrate;
determining, based on the position of the first mark and the position of the second mark detected in the detecting, a point to form the through electrode in the substrate so as to electrically connect the pattern to the electrode pad; and
forming the through electrode at the determined point.

13. The method according to claim 1, wherein the light used to detect the first mark is infrared light.

14. A method comprising:
preparing a first substrate having a first mark and a first circuit pattern including an electrode pad;
preparing a second substrate having a second mark and a second circuit pattern;
joining the second substrate on the first substrate;
detecting a position of the first mark of the first substrate and a position of the second mark of the second substrate in a state in which the first substrate and the second substrate are joined, wherein the position of the first mark is detected through the second substrate using light transmitted through the second substrate;
determining, based on the position of the first mark and the position of the second mark detected in the detecting, a point to form the through electrode in the second substrate so as to electrically connect the pattern to the electrode pad;
forming a through electrode, in the second substrate, at the determined point; and
forming a pattern on the second substrate such that the pattern is electrically connected to the electrode pad via the through electrode.

15. The method according to claim 14, wherein the light used to detect the first mark is infrared light.

\* \* \* \* \*